United States Patent [19]
Adams et al.

[11] 3,950,184
[45] Apr. 13, 1976

[54] MULTICHANNEL DRAINAGE SYSTEM

[75] Inventors: Anthony L. Adams, Richardson, Tex.; Darien Fenn, North Little Rock, Ark.

[73] Assignee: Texas Instruments Incorporated, Dallas, Tex.

[22] Filed: Nov. 18, 1974

[21] Appl. No.: 524,592

[52] U.S. Cl. .................... 134/10; 134/26; 134/32; 134/96; 233/18; 233/32; 427/240
[51] Int. Cl.² ........................................... B08B 7/04
[58] Field of Search ........... 134/33, 26, 10, 96, 104, 134/63, 155, 160; 427/240; 233/32, 21, 18

[56] References Cited
UNITED STATES PATENTS

| | | | |
|---|---|---|---|
| 1,981,453 | 11/1934 | Hyde | 427/240 |
| 3,041,225 | 6/1962 | Emeis | 134/33 X |
| 3,489,608 | 1/1970 | Jacobs et al. | 134/33 X |

*Primary Examiner*—Arthur D. Kellogg
*Attorney, Agent, or Firm*—Harold Levine; James T. Comfort; James O. Dixon

[57] ABSTRACT

Disclosed is a multichannel drainage system for separately draining the centrifugally broadcast residue of different liquids sequentially dispensed on the top surface of a semiconductor wafer spun on a spindle at a work station. The multichannel drainage system includes a cup assembly mounted on a cup plate which is raised and lowered by elevator apparatus. The cup assembly has a lower drainage cup forming an annular channel and a first outlet communicating with the channel. An upper drainage cup, stacked atop the lower cup, forms a second annular channel communicating with a second outlet. The elevator apparatus raises or lowers the cup plate under the action of a cam. The cam has a three-stage profile, with each stage corresponding to a stationary position of the cup assembly relative the wafer. In the home position for loading and unloading the wafer, the cup assembly is below the wafer. In a second position, the spun wafer is disposed within the upper cup of the assembly so that the centrifugally broadcast residue of a first liquid applied to the wafer is received by the upper cup and drained through the first outlet. In the third position, the spun wafer is disposed within the lower cup of the assembly so that the centrifugally broadcast residue of a second liquid applied to the wafer is received by the lower cup and drained through the second outlet.

7 Claims, 6 Drawing Figures

MULTICHANNEL DRAINAGE SYSTEM

This invention relates to systems for draining the centrifugally broadcast liquid residues from a semiconductor wafer spun at a work station and more particularly to multichannel drainage systems for separately draining the centrifugally discharged residues of different liquids sequentially dispensed on a spun wafer surface.

During the manufacture of semiconductor wafers, the wafers are treated with various liquid substances. This operation may be accomplished at a work station disposed on the air track of a pneumatic conveyor used in transporting the wafers during manufacture. Since wafers are processed almost totally by automated equipment, the work station is disposed within the air track beneath the surface thereof, so that wafers may be pneumatically conveyed to and from the station. Upon activation of the work station, the operational implements associated with the performance of the specified functions are raised above the track surface to engage and manipulate the wafers.

The work station where the wafers are to be treated with liquids may generally be characterized as having a vacuum chuck disposed on a spindle. Each conveyed wafer slice is loaded on the chuck and spun. The liquid material is dispensed at the center of the top surface of the wafer. The liquid thus dispensed covers the spinning wafer from the center to the periphery. At the periphery of the wafer, the liquid residue is radially broadcast by centrifugal force. This discharge must be contained, and is preferably recovered to facilitate recycling of the liquid.

Another aspect of the treatment of semiconductor wafers with liquid involves the fact that it is frequently necessary to treat semiconductor wafers with different liquids, sometimes in rapid succession. It is considered desirable to maintain separation between the residues of these different liquids for various reasons. Certain liquids utilized in the treatment of semiconductor wafers are prone to chemical interaction, possibly leading to combustion. Additionally, maintaining separation between the liquid residues facilitates recycling of the liquids.

The present invention comprises a multichannel draining system which fulfills the foregoing and other requirements long since found wanting in the prior art. In accordance with the broader aspects of the invention, there is provided a cup assembly including a plurality of stacked drainage cups, each having an isolated drainage outlet. Structure is provided for aligning a particular drainage cup of the assembly with a spinning semiconductor wafer during the application of a particular liquid thereto. The drainage cups thus contain and recover the liquid residues which are broadcast from the spinning semiconductor wafer, and simultaneously maintain separation between the residues of the various liquids which are utilized in the treatment of the wafer.

In accordance with more specific aspects of the invention, the cup assembly comprises a lower drainage cup mounted on a cup plate and an upper drainage cup mounted on the lower drainage cup. The upper and lower drainage cups are both annular in configuration, and have isolated extending drainage outlets. The cup assembly is positioned relative to a semiconductor wafer to be treated by a cam operating through a cam follower. The cam sequentially positions the cup assembly in a first position which facilitates the loading and the unloading of the semiconductor wafer, in a second position wherein the upper drainage cup is positioned to receive liquid residue broadcast from the semiconductor wafer, and in a third position wherein the lower cup is positioned to receive liquid residue broadcast from the semiconductor wafer.

The invention and further advantages thereof will be better understood by reference to the following detailed description of an illustrative embodiment taken in conjunction with the accompanying drawings in which.

Figure 1:
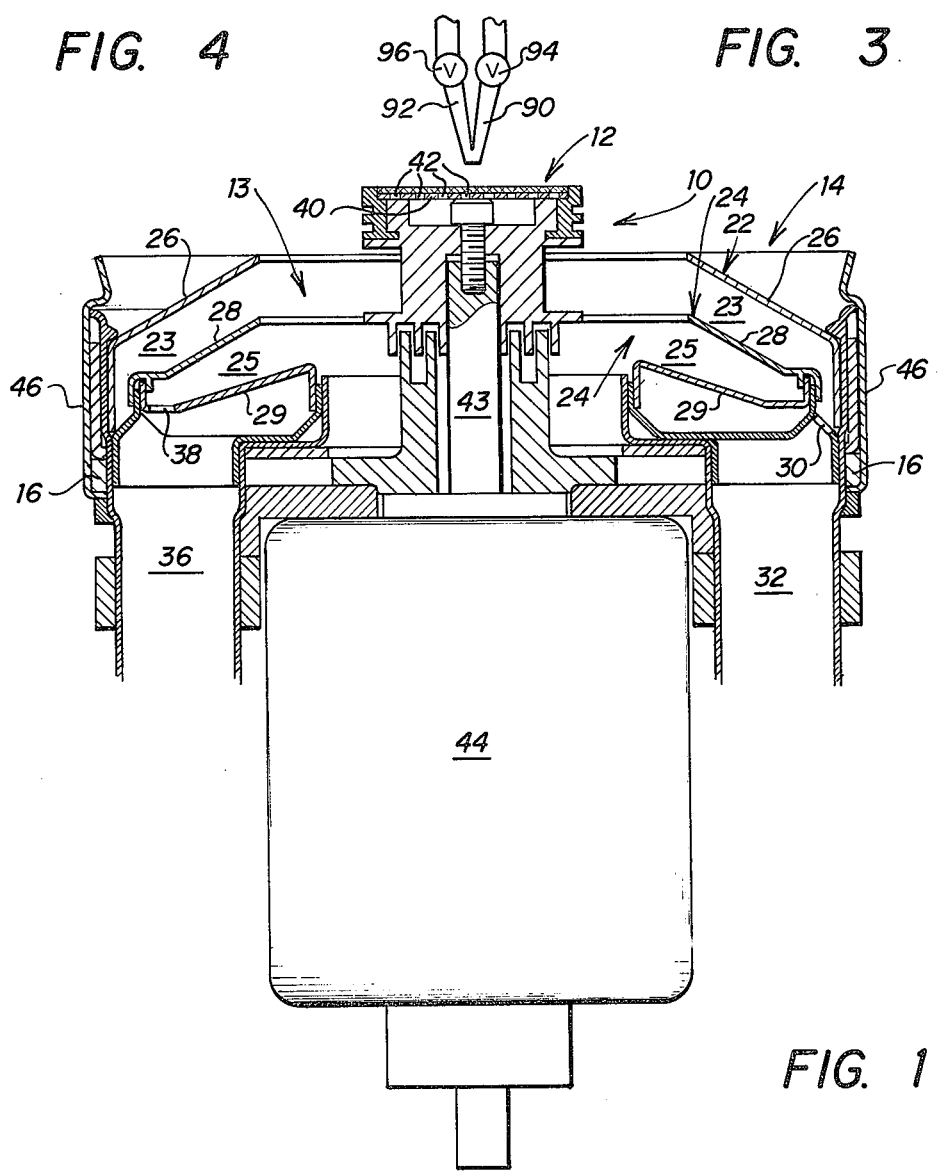
FIG. 1 is an elevated sectional view of a system in accordance with the invention.

Referring to FIG. 1, the present invention includes a cup assembly 14 mounted on a cup plate 16. The cup assembly 14 is disposed annularly with respect to a vacuum chuck 10 which holds a wafer 12 to be spun. As is better shown in FIG. 2, the cup plate 16 is supported by a pair of support struts 20 connecting the cup plate 16 and an elevator apparatus 18. Cup assembly 14 forms a single unit containing a centrally disposed opening 13. The opening 13 is of a sufficient size to allow vacuum chuck 10 to pass freely therethrough.

Figure 4:
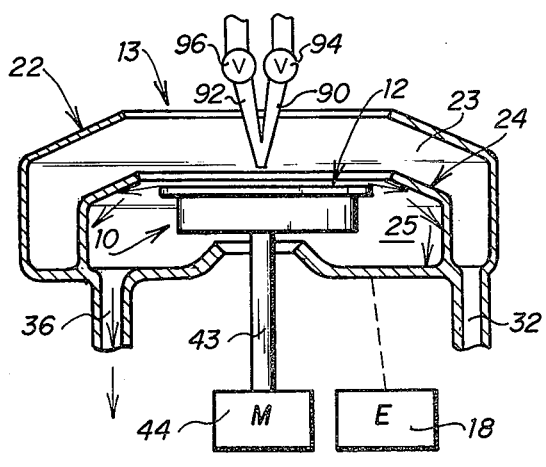
FIG. 4 is a diagrammatic representation of the device of the instant invention in the third position.
Figure 3:
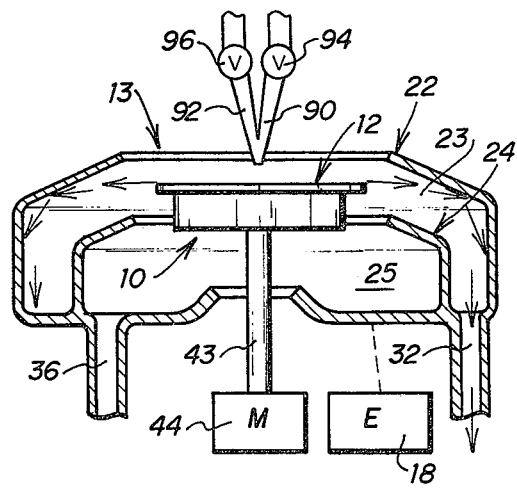
FIG. 3 is a diagrammatic representation of the device in accordance with the invention in the second position.

The elevator apparatus 18 is effective to raise the cup plate 16 and therefore the cup assembly 14 from the home position as shown in FIG. 1 to a second position as shown in FIG. 3, and finally to a third position, as shown in FIG. 4. The vacuum chuck 10 stays substantially stationary throughout this operation.

More specifically, the vacuum chuck 10 is disposed centrally of a work station (not shown) for treating semiconductor wafers with liquids. The chuck 10 is supportingly connected to the output shaft 43 of an electric motor 44. The chuck 10, which may be one of the commercially available types, has a vacuum mat 40 containing a plurality of air inlets 42 which communicate with a vacuum source (not shown).

The semiconductor wafer 12 is preferably transported to the chuck 10 on an air track (not shown) and is loaded in the chuck 10. The wafer 12 in the loaded position is disposed flush on mat 40, being pulled into mating engagement therewith by vacuum action about the inlets 42. The wafer is preferably disposed such that the center of mass is approximately coincident with the center of rotation of the vacuum chuck 10. Upon energizing the motor 44, the chuck 10, and thus the wafer 12 is spun at a rate of about 500 rpm to about 6000 rpm, depending upon the particular coating operation.

Still referring to FIG. 1, the centrally disposed opening 13 communicates between the top and the bottom of the cup assembly 14. The assembly 14 includes an upper drainage cup 22 stacked upon a lower drainage cup 24. The upper cup 22 can best be described as forming a sloping annular channel 23, having a top sloping member 26 and a bottom sloping member 28, which meet at their lower ends to form the annular channel 23. Communicating with the channel 23 through an orifice 30 is a drainage outlet 32.

The lower cup 24 can also be described as forming a sloping annular channel 25. The channel 25 has a top sloping member 28, which is the bottom sloping member 28 of upper cup 22, and bottom sloping member 29. Sloping members 28 and 29 meet at their lower ends, thus forming the annular channel 25. Communicating with channel 25 through an orifice 38 is a drainage outlet 36. As can be seen in FIG. 1, drainage outlets 36 and 32 are separate outlets. Thus, upper cup 22 and lower cup 24 form separate and distinct drains within assembly 14.

It will be appreciated that the exact configurations of the upper drainage cup 22 and the lower drainage cup 24 may be substantially modified. The upper channel forming surfaces of each cup needs to be inclined sufficiently to allow a gravitational flow of the discharged residue for proper draining. Additionally, the width of the channel opening through which the radiated residue passes must be of sufficient size to allow substantially the entire diverging spray of the radiated residue to pass therethrough. Further, it will be realized that more than one orifice may be utilized to connect the channel with the outlet. Preferably, the portion of the chamber containing the orifice is disposed relatively lower than the remaining portion of the channel to facilitate a sufficient gravitational flow of liquids therethrough.

Figure 2:
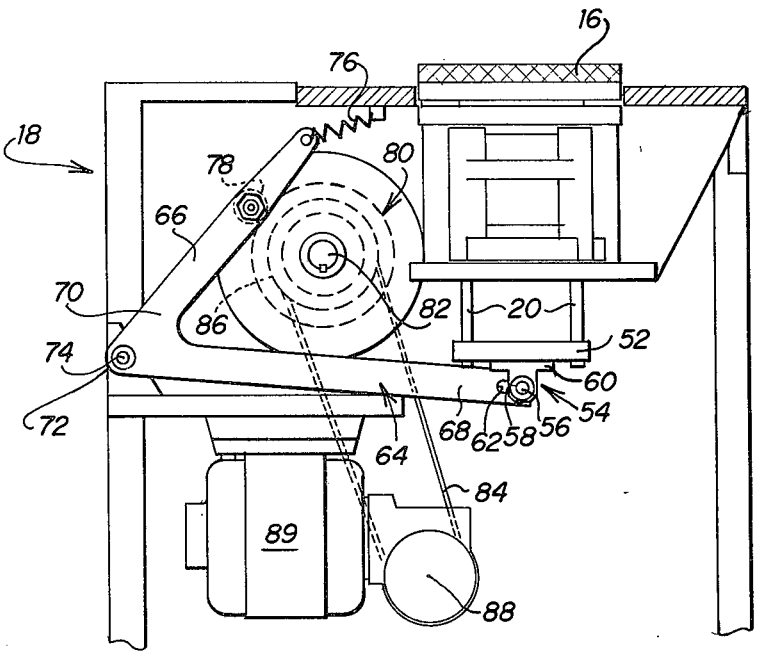
FIG. 2 is a detailed sectional view of the elevator used in a preferred embodiment of the invention.
Figure 5:
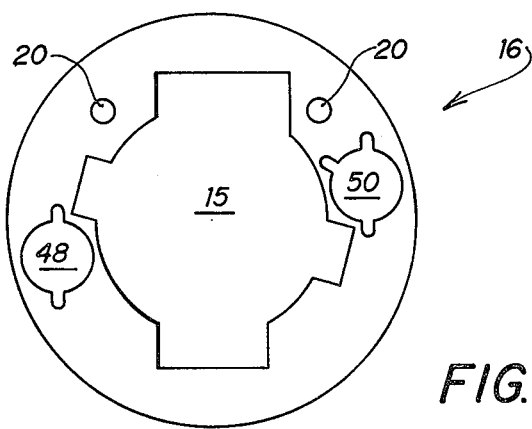
FIG. 5 is a top view of the cup plate.

The cup assembly 14 is securely mounted upon cup plate 16 to form a single assembly. Cup plate 16 is affixed to the assembly 14 by means of an annular casing 46. As better seen in FIG. 5, cup plate 16 has a centrally disposed opening 15 which communicates with the opening 13 in assembly 14. Disposed on either side of opening 15 is a pair of orifices 48 and 50, through which outlets 32 and 36 pass, respectively. One end of each of support struts 20 is securely fastened to cup plate 16 adjacent the opening 15. As shown in FIG. 2, the support struts 20 are connectively supported on their other end to one side of a lift plate 52.

A pivotal lift support 54 is supportingly connected to the lift plate 52 on one end and to a cam follower arm 64 on the other. The support 54 comprises a pivot 56, connecting a sliding support member 58 and a flanged support member 60. The flange support member 60 is supportingly connected to the lift plate 52, and through the pivot 56, to the sliding support 58.

The sliding support 58 is slidingly housed in slot 62 in a cam follower arm 64. The cam follower arm 64 is a bell crank and has two straight portions 66 and 68 connected at an intersection 70. The follower arm 64 is pivotally connected to a housing 72 by means of a pin 74. Connected at one end of portion 66 is a spring 76. The spring 76 resiliently connects the housing 72 with the straight portion 66. Portion 66 carries a cam follower roller 78.

A cam 80 freely rotates on a bearing assembly 82. A pulley 86 is attached to the cam 80. The cam 80 is rotationally driven upon the bearing assembly 82 by a belt 84 disposed about the pulley 86 and a motor pulley 88 driven by a motor 89. The cam 80 has eccentric portions which conform to a cam profile, as shown in FIG. 6.

Referring again to FIg. 1, conduits 90 and 92 communicate through valves 94 and 96 respectively, with different liquid sources (not shown). Valves 94 and 96 are of a remote control type which can be commanded to sequentially open and close in an operating cycle at a work station for treating semiconductor wafers.

In operation, the multichannel drainage system of the instant invention resides quiescently in a deactivated work station. Upon activation, a treating cycle commences with the cam 80 driven by energized motor 89 positioned as shown in FIG. 6 at 0°. The cam roller 78 is resiliently held against the cam 80 by spring 76. The cam follower arm 64 is thus positioned accordingly and supports the cup assembly 14 in the home position or first position as shown in FIG. 1. As a cycle proceeds, the wafer 12 is received in vacuum chuck 10. The vacuum source (not shown) is applied through air inlets 42 to create a vacuum action on the underside of wafer 12, to pull it flush onto vacuum mat 40. The motor 44 is energized to spin the wafer within the chuck 10.

Figure 6:
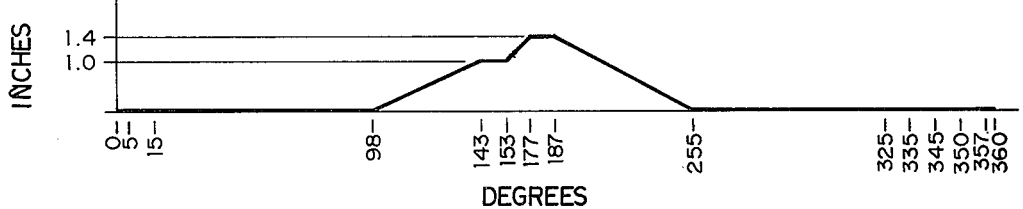
FIG. 6 is a schematic representation of the profile of the eccentric portion of the cam means.

As the cam 80 is rotated beyond 98° as shown in FIG. 6, the portion 68 of arm 64 is raised. As the portion 68 raises the lift plate 52 and thus the cup plate 16, the cup assembly 14 is maintained in the proper horizontal attitude with respect to chuck 10 by cooperation of support 54 and slot 62. Thus, support struts 20 and cup plate 16 are vertically raised without appreciable side motion.

As the cycle continues, the cam 80 is rotated from 98° to 143° as shown in FIG. 6. The cam 80 thus operates through the cam follower arm 64, the plate 52, the struts 20 and the plate 16 to raise the cup assembly 14 from position one to position two. In this position cup assembly 14 is disposed with respect to the wafer carrying chuck 10 in position two as shown in FIG. 3.

In position two, the wafer is disposed such that a centrifugally discharged liquid residue from the spinning wafer surface will contact the sloping member 26 of the upper cup 22, as shown by the arrows in FIG. 3. The residue gravitationally flows within channel 23, through orifice 30, and into outlet 32.

Valve 94 is opened and the treating liquid from a source (not shown) travels through conduit 90 onto the top surface of spinning wafer 12. The liquid covers the wafer from the center to the periphery. At the periphery the liquid residue is radially broadcast by centrifugal force. The centrifugally discharged liquid residue contacts the sloping member 26 of upper cup 22 and flows within channel 23 through orifice 30 and exits through outlet 32. The exiting liquid is discarded or processed (not shown). When the treating procedure is complete, the valve 94 is closed.

During the dispensing operation, the cam moves from 143° to 153° as shown in FIG. 6. During the corresponding time increment, the position of the upper cup 24 relative to the wafer 12 remains fixed.

As the cam 80 rotates from 153° to 178° as shown in FIG. 6, the cup assembly 14 is raised from position two (FIG. 3) to position three (FIG. 4). As before, the proper horizontal attitude with respect to chuck 10 is maintained by cooperation of support 54 and slot 62. Thus, the cup assembly 14 is vertically raised without appreciable side motion.

In position three, the wafer is disposed such that a centrifugally discharged liquid residue from the spinning wafer surface will contact the sloping member 28 of lower cup 24, as shown by the arrows in FIG. 4. Valve 96 is then opened and a treating liquid flows through conduit 92 onto the top surface of spinning wafer 12. The liquid covers the wafer from the center to the periphery. At the periphery of the wafer, the liquid residue is radially broadcast by centrifugal force. The centrifugally discharged liquid residue contacts the sloping member 28 of lower cup 24. The residue gravitationally flows within channel 25 through orifice 38 and into outlet 36. The residue exiting outlet 36 is discharged or processed (not shown).

As the cycle continues, the valve 96 is closed and the cam 80 rotates to 187° as shown in FIG. 6. During the rotation of the cam from 177°, the positioning of the cup assembly relative to the wafer 12 remains fixed. As the cam 80 rotates beyond 187°, the cup assembly 14 is lowered, and when the cam 80 reaches 255° as shown in FIG. 6, the assembly 14 has returned to the home position as shown in FIG. 1. The cam continues to rotate through 360° until the starting position is again obtained. During this time, the wafer is unloaded from chuck 10.

Thus, spinning semiconductor wafers may be treated with different liquids sequentially applied. The residues of the liquids are centrifugally broadcast from the wafer, into the drainage system of the instant invention, while separation between the residues of the various liquids is simultaneously maintained.

It will be realized that the cam profile shown in FIG. 6 may be varied to correspond to different coating operations of different duration. Additionally, the sequence of the raising may be varied such that for example, the spinning wafer 12 is disposed first in the lower cup and then in the upper cup. Moreover, in a treating process in which the same liquid is applied at different times, the profile may be varied so that a particular position is visited more than once in a complete cycle.

It will also be realized that the elevator apparatus may be other than a cam. For example, fluid powdered cylinders, lead screws, and the like may be utilized to effect the positioning of the spinning wafer sequentially within the cups of the cup assembly.

Having described the invention in connection with certain specific embodiments thereof, it is to be understood that further modifications may now suggest themselves to those skilled in the art and it is intended to cover such modifications as fall within the scope of the appended claims.

We claim:

1. A drainage system for separately draining the centrifugally broadcast residue of different liquids sequentially dispensed on a spinning semiconductor wafer comprising:
   a. a cup assembly comprising a plurality of stacked drainage cups, each of said cups having a separate outlet; and
   b. means for aligning a particular drainage cup of the cup assembly with said spinning wafer during the treatment of said wafer with a predetermined liquid.

2. The system of claim 1 further comprising a cup plate rigidly attached to and supporting said cup assembly and in turn rigidly attached to and supported by said aligning means.

3. The system of claim 2 wherein said aligning means comprises:
   a. a housing;
   b. a cam follower arm pivotally attached to said housing and to said cup plate; and
   c. a cam having an eccentric portion; and
   d. a cam follower roller rotationally attached to said cam follower arm and engaging said eccentric portion of said cam.

4. A method for separately draining the centrifugally broadcast residue of different liquids sequentially dispensed on a semiconductor wafer spun on a spin order work station comprising the steps of:
   aligning a multichannel drain system containing a plurality of stacked drainage cups, each with an isolated outlet, such that said wafer is disposed within a predetermined drainage cup during the treatment of said wafer with a predetermined liquid.

5. The method of claim 4 comprising the further steps of:
   a. initially positioning a semiconductor wafer in a chuck disposed at a work station for treating said wafer;
   b. spinning said wafer in said chuck;
   c. aligning a first drainage cup having a separate outlet with said spinning wafer so that said wafer is disposed within said cup to contain and recover a first liquid dispersed on the top of said wafer;
   d. aligning a second drainage cup having an isolated outlet with said spinning wafer so that said wafer is disposed within said second drainage cup to contain and recover a second liquid dispersed on the top surface of said wafer.

6. A drainage system for separately draining the centrifugally broadcast residue of two different liquids sequentially dispensed on a semiconductor wafer comprising:
   a. a spinning vacuum chuck disposed at a work station;
   b. a cup assembly comprising a lower drainage cup forming a first annular channel communicating with a first outlet and an upper drainage cup stacked atop the lower cup, forming a second annular channel communicating with a second outlet;
   c. a cup plate containing a centrally disposed opening and being rigidly attached to said cup assembly; and
   d. a means for aligning a predetermined drainage cup of said cup assembly with said spinning wafer during the treatment of said wafer with a predetermined liquid to contain and recover the liquid residues which are centrifugally broadcast from said spinning wafer while simultaneously maintaining separation between said various liquid residues.

7. The system of claim 6 wherein said means for aligning the cup assembly comprises:
   a. a housing;
   b. a cam follower arm pivotally attached to said housing containing a slot of one end;
   c. a cam follower roller carried on said cam follower arm;
   d. a cam having an eccentric portion engaging said cam follower roller;
   e. a spring attached to said cam follower arm at the end opposite said slot and to said housing;
   f. a pivotal lift support slidably mounted in said slot; and
   g. a lift plate rigidly attached to said pivotal lift support and to said cup plate.

* * * * *